US009240771B2

(12) United States Patent
Lee et al.

(10) Patent No.: US 9,240,771 B2
(45) Date of Patent: Jan. 19, 2016

(54) METHOD AND APPARATUS FOR GENERATING SIGNAL HAVING CONVERTED SAMPLING RATE IN COMMUNICATION SYSTEM

(75) Inventors: Joo-Hyun Lee, Suwon-si (KR); Sung-Kwon Jo, Suwon-si (KR); Ha-Young Yang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 641 days.

(21) Appl. No.: 13/368,656

(22) Filed: Feb. 8, 2012

(65) Prior Publication Data

US 2012/0203812 A1 Aug. 9, 2012

(30) Foreign Application Priority Data

Feb. 8, 2011 (KR) ........................ 10-2011-0010980

(51) Int. Cl.
*H03H 17/06* (2006.01)
*H04B 1/00* (2006.01)

(52) U.S. Cl.
CPC ....... *H03H 17/0685* (2013.01); *H03H 17/0628* (2013.01); *H04B 1/0017* (2013.01); *H04B 1/0021* (2013.01)

(58) Field of Classification Search
USPC ............................................ 708/313; 341/61
See application file for complete search history.

(56) References Cited

U.S. PATENT DOCUMENTS

| | | | | |
|---|---|---|---|---|
| 4,020,332 A | * | 4/1977 | Crochiere et al. ............ | 708/290 |
| 5,621,404 A | * | 4/1997 | Heiss et al. ................... | 341/61 |
| 6,061,410 A | * | 5/2000 | Linz ............................... | 375/371 |
| 6,141,671 A | * | 10/2000 | Adams et al. ................. | 708/313 |
| 6,288,794 B1 | * | 9/2001 | Honary ......................... | 358/1.2 |
| 6,462,682 B2 | * | 10/2002 | Hellberg ........................ | 341/61 |
| 2004/0117764 A1 | * | 6/2004 | Sinha et al. ................... | 717/110 |

OTHER PUBLICATIONS

Wikipedia.org, "Ratio", retrieved from http://en.wikipedia.org/wiki/Ratio.*
MathIsFun.org, "Ratios", retrieved from http://www.mathsisfun.com/numbers/ratio.html.*
Alan V. Oppenheim, Ronald W. Schafer, with John R. Buck, Discrete-Time Signal Processing, Second Edition, 1999, Prentice-Hall Inc., Upper Saddle River, New Jersey.

* cited by examiner

*Primary Examiner* — Chat Do
*Assistant Examiner* — Matthew Sandifer
(74) *Attorney, Agent, or Firm* — Jefferson IP Law, LLP

(57) ABSTRACT

A method of generating a signal having a converted sampling rate in a communication system is provided. The method includes selecting effective input samples among S number of input samples included in an input stream corresponding to an input sampling rate, generating a filter coefficient set including filter coefficients having a length of a second tap, the filter coefficients having the length of the second tap being generated by dividing a filter coefficient having a length of a first tap configuring a low-pass filter into the filter coefficients having the length of the second tap corresponding to a number of selected effective input samples, selecting filter coefficients corresponding to each of the effective input samples among the filter coefficients included in the filter coefficient set, and outputting output samples having an output sampling rate which is converted from the input sampling rate.

6 Claims, 8 Drawing Sheets

METHOD AND APPARATUS FOR GENERATING SIGNAL HAVING CONVERTED SAMPLING RATE IN COMMUNICATION SYSTEM

PRIORITY

This application claims the benefit under 35 U.S.C. §119 (a) of a Korean patent application filed in the Korean Industrial Property Office on Feb. 8, 2011 and assigned Serial No. 10-2011-0010980, the entire disclosure of which is hereby incorporated by reference.

BACKGROUND OF THE INVENTION

1. Field of the Invention

The present invention relates to a method and an apparatus signaling in a communication system. More particularly, the present invention relates to a method and an apparatus for generating a signal having a converted sampling rate in a communication system.

2. Description of the Related Art

In modern society, there co-exist mobile communication devices variously supporting a plurality of communication schemes according to a rapidly developed communication technique. Accordingly, a situation in which support for different communication schemes may be necessitated for a service region supporting a specific communication scheme, is frequently encountered. In this case, an establishment of a system for supporting a new communication scheme requires a considerable expense and an inefficient allocation of resources.

Therefore, a need exists for a method of supporting different communication schemes using a pre-installed base station.

FIG. 1 is a block diagram illustrating a base station in a related communication system.

Referring to FIG. 1, a base station 100 includes a Digital Unit (DU) 110 for processing a transmission/reception signal in a baseband, a Radio Frequency (RF) Unit (RU) 130 for processing a transmission/reception signal in an Inter Frequency (IR) band or an RF band, and a DU-RU interface 120 for serving as an interface between the DU 110 and the RU 130. The DU 110 includes a higher layer block 112, a Down Link (DL) transmission modem 114, and an Up Link (UL) reception modem 116. The RU 130 includes a digital-up converter 132, a digital-down converter 134, a Digital Analog Converter (DAC) 136, an Analog Digital Converter (ADC) 138, a transmission RF path 140, and a reception RF path 142. When it is desired to connect the base station 100 having the aforementioned configuration to a base station which uses the same system bandwidth as the base station 100, which uses a sampling rate in a different baseband, and which supports a different communication system, while using the RU 130 of the base station 100 as in its current configuration, a conversion of the sampling rate between the DU 110 and the RU 130 is necessary.

FIG. 2 is a diagram schematically illustrating a related sampling rate converting apparatus.

Referring to FIG. 2, the sampling rate converting apparatus 200 includes an expander 205, a low-pass filter 210, and a compressor 215.

A related method of converting a sampling rate will be described based on an example of converting a sampling rate of a fractional rate (L/M). Herein, L and M are natural numbers, respectively. Referring to FIG. 2, the expander 205 increases an input sampling rate by L times and transfers the L-times increased input sampling rate to the low-pass filter 210. The low-pass filter 210 is a tap-K Finite Impulse Response (FIR) filter. The low pass filter 210 performs a linear interpolation using a low-pass filtering to the L-times increased input sampling rate. The compressor 215 decreases the sampling rate by M times. Accordingly, in order to convert the sampling rate by the rate of L/M, a high clock corresponding to L times of the input sampling rate is necessary, and a multiplication calculation amount required for the low-pass filtering is increased in proportion to M×K. If L and M in the conversion rate L/M of the sampling rate are increased, a complexity for calculation of the sampling rate is increased. Consequently, it becomes impossible to implement the conversion of a corresponding sampling rate through the aforementioned method of converting the sampling rate.

Accordingly, a need exists for a method and an apparatus for generating a signal having a converted sampling rate in a communication system.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide a method and an apparatus for generating a signal having a converted sampling rate.

Another aspect of the present invention is to provide a method and an apparatus for connecting a base station of a heterogeneous communication system using a system bandwidth identical to that of a base station in a communication system and a sampling rate in a different baseband to an RF device of the base station of the communication system.

Another aspect of the present invention is to provide a method and an apparatus for generating a signal having a converted sampling rate, in which a sampling rate of a Digital Unit (DU) configuring the base station is converted to a sampling rate of an Radio Frequency (RF) Unit (RU) so as to connect a base station of a communication system to a base station of a heterogeneous communication system using the same system bandwidth as the base station of the communication system and a sampling rate of a different baseband to an RF device of the base station of the communication system.

In accordance with an aspect of the present invention, a method of generating a signal having a converted sampling rate in a communication system is provided. The method includes selecting effective input samples among S number of input samples included in an input stream corresponding to an input sampling rate, generating a filter coefficient set including filter coefficients having a length corresponding to a length of a second tap, the filter coefficients having the length corresponding to the length of the second tap being generated by dividing a filter coefficient having a length corresponding to a length of a first tap configuring a low-pass filter into the filter coefficients having the length corresponding to the length of the second tap corresponding to a number of selected effective input samples, selecting filter coefficients corresponding to each of the effective input samples among the filter coefficients included in the filter coefficient set, and outputting output samples having an output sampling rate which is converted from the input sampling rate so as to correspond to a conversion rate by multiplying each of the effective input samples and the selected filter coefficients, wherein the conversion rate is a fraction having a numerator of a natural number L and a denominator of a natural number M, and wherein S is a positive integer.

In accordance with another aspect of the present invention, an apparatus for generating a signal having a converted sampling rate in a communication system is provided. The apparatus includes an input buffer for storing an input stream corresponding to an input sampling rate, and a controller for controlling the input buffer such that effective input samples among S number of input samples included in the input stream are output from the input buffer, for generating a filter coefficient set including filter coefficients having a length corresponding to a length of a second tap, the filter coefficients having the length corresponding to the length of the second tap being generated by dividing a filter coefficient having a length corresponding to a length of a first tap configuring a low-pass filter into the filter coefficients of the length corresponding to the length of the second tap corresponding to a number of selected effective input samples, for selecting filter coefficients corresponding to each of the effective input samples among the filter coefficients included in the filter coefficient set, for controlling a low-pass filter such that each of the effective input samples is multiplied with the selected filter coefficients, and for controlling an output buffer such that the output buffer outputs output samples having an output sampling rate which is converted from the input sampling rate so as to correspond to a conversion rate among output samples output from the low-pass filter, wherein the conversion rate is a fraction having a numerator of a natural number L and a denominator of a natural number M, and wherein S is a positive integer.

In accordance with an aspect of the present invention, the input buffer is controlled such that the input buffer outputs the input samples corresponding to the final output samples having the converted sampling rate, adaptively sets the filter coefficients for performing the low-pass filtering to the input samples output from the input buffer, and controls the output buffer such that the output buffer outputs the final output samples so as to correspond to the output sampling rate, so that a complexity in the conversion of the sampling rate between the DU and the RU included in the base station is reduced and thus it is possible to connect a base station of a heterogeneous communication system using a system bandwidth identical to that of the base station and a sampling rate in a different baseband to the RU of the base station.

In accordance with an aspect of the present invention, a method of generating a signal having a converted sampling rate in a communication system is provided. The method includes receiving an input stream comprising S number of input samples, selecting effective input samples among the S number of input samples based on an input sampling rate, generating a filter coefficient set including filter coefficients, selecting filter coefficients corresponding to each of the effective input samples among the filter coefficients included in the filter coefficient set, and outputting output samples having an output sampling rate which is converted from the input sampling rate so as to correspond to a conversion rate by multiplying each of the effective input samples and the selected filter coefficients, wherein the conversion rate is a fraction having a numerator of a natural number L and a denominator of a natural number M, and wherein S is a positive integer.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF THE EXEMPLARY EMBODIMENT

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Exemplary embodiments of the present invention suggest a method and an apparatus for generating a signal having a converted sampling rate in a communication system.

Prior to describing exemplary embodiments of the present invention, a related sampling rate conversion scheme will be described with reference to FIG. 3.

Figure 3:
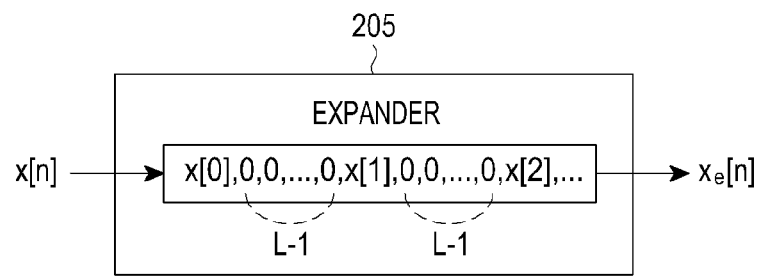
FIG. 3 is a block diagram illustrating an internal structure of an expander in a related sampling rate converting apparatus.

FIG. 3 is a block diagram illustrating an internal structure of an expander included in a related sampling rate converting apparatus.

Figure 1:
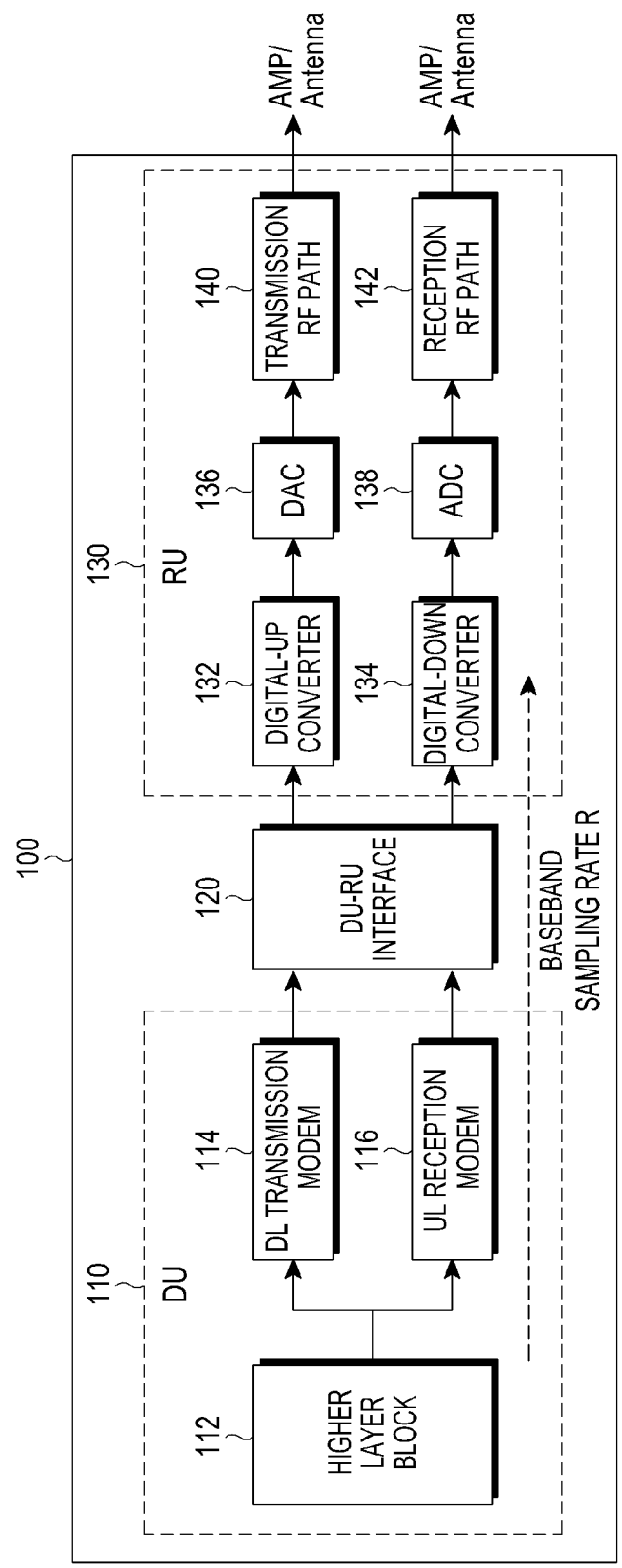
FIG. 1 is a block diagram illustrating a base station in a related communication system.
Figure 2:
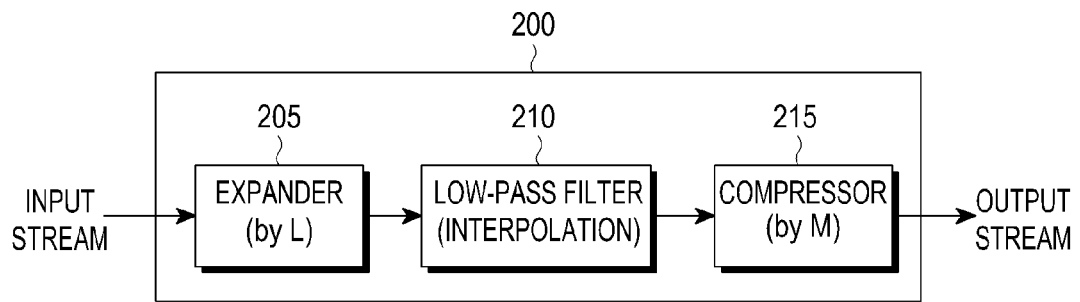
FIG. 2 is a block diagram illustrating a related sampling rate converting apparatus.

In the description of FIG. 3, it is assumed that the expander is the expander 205 illustrated in FIG. 2.

First, the related sampling rate converting apparatus converts a sampling rate $R_{In}$ of an input stream in a rate of L/M and outputs a sampling rate $R_{Out}$ of a final output stream with $R_{Out}=L/M \times R_{In}$. Herein, L and M are natural numbers, respectively.

Referring to FIG. 3, when the input stream is x[n], wherein n=0, 1, . . . , and N−1, the expander 205 inserts L−1 number of "0"s between samples configuring the input stream and increases an input sampling rate by L times. The expander 205 outputs the input stream $x_e[n]$ having the L-times increased input sampling rate, (i.e. $R_{Up}=L \times R_{In}$), defined by Equation 1 through a low-pass filter for performing a liner interpolation.

$$x_e[n] = \left\{ \begin{array}{l} x\left[\frac{n}{L}\right] \\ 0 \end{array} \right\}, n = 0, \pm L, \pm 2L, \ldots ,$$

otherwise, $n = 0, 1, \ldots LN - 1$ (1)

Figure 4:
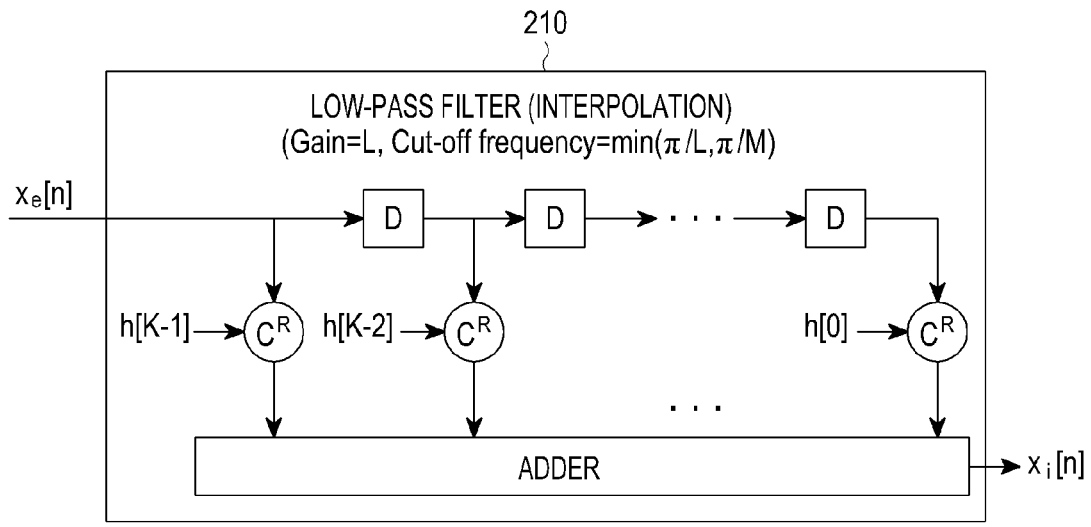
FIG. 4 is a block diagram illustrating an internal structure of a low-pass filter in a related sampling rate converting apparatus.

FIG. 4 is a block diagram illustrating an internal structure of a low-pass filter included in a related sampling rate converting apparatus.

In the description of FIG. 4, it is assumed that the low-pass filter is the low-pass filter 210 illustrated in FIG. 2.

Referring to FIG. 4, the low-pass filter 210 removes image components generated due to "0"s inserted by the expander 205 from the input stream $x_e[n]$ input to the low-pass filter 210 from the expander 205. The low-pass filter 210 performs a liner interpolation for preventing an aliasing that may be generated due to a decimation operation of the compressor 215. It is assumed that the low-pass filter 210 has a gain of L and a cut-off frequency of min (π/L, π/M). Although, an infinite number of taps are necessary for an ideal operation of the low-pass filter 210, actual implementation of such a low-pass filter is impossible. Accordingly, the low-pass filter 210 includes an approximated predetermined number of FIR filters and an adder. The low-pass filter 210 performs a low-pass filtering for the input $x_e[n]$ and outputs to the compressor 215 a linear interpolated output stream $x_i[n]$ defined by Equation 2.

$$x_i[n]=x_e[n]*h_{LPF}[n], n=0,1,\ldots,LN+K-1 \quad (2)$$

With reference to Equation 2, * denotes a convolution calculation, $h_{LPF}[n]$, n=0, 1, . . . , K−1 are indicators of taps of the low-pass filter 210, and K denotes a number of taps of the low-pass filter 210.

Figure 5:
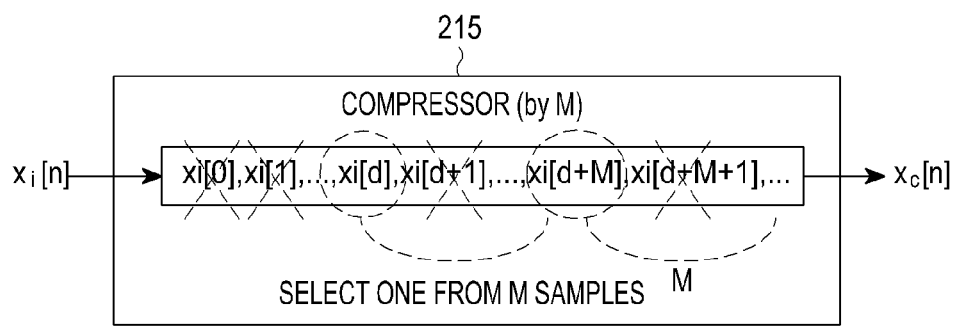
FIG. 5 is a block diagram illustrating an internal structure of a compressor in a related sampling rate converting apparatus.

FIG. 5 is a block diagram illustrating an internal structure of a compressor of a related sampling rate converting apparatus.

In the description of FIG. 5, it is assumed that the compressor is the compressor 215 illustrated in FIG. 2.

Referring to FIG. 5, the compressor 215 selects only one sample for every M number of samples among the samples included in the linear interpolated output stream $x_i[n]$ and outputs the selected sample. In this case, an output stream of the compressor 215 is defined by Equation 3 and has a converted sampling rate, $R_{Out}=L/M \times R_{In}$.

$$x_c[n] = x_i[nM], n = 0, 1, \ldots , \left(\frac{L}{M}\right)N - 1 \quad (3)$$

As described above, the related method of converting the sampling rate has a limited implementation range depending on a conversion rate (L/M) of the sampling rate. That is, in the related method of converting the sampling rate, it is only possible to convert the sampling rate by a rate of a simple fraction (e.g. ⅔). However, if the rate of the fraction is complex, it becomes impossible to implement the sampling rate conversion through the related method of converting the sampling rate. For example, in order to convert the sampling rate by a rate of 218/321, a clock corresponding to 218 times of the input sampling rate is required. Further, because the number of taps of the low-pass filter 210 (e.g., represented by K) is in inverse proportion to the cut-off frequency of the low-pass filter 210 (i.e. in proportion to max (L, M)), 321×k times of complex number multiplications are necessary for each output sample for the low-pass filtering with a cut-off frequency of "π/321".

For example, a Long Term Evolution (LTE) base station using a system bandwidth of 10 MHz has a baseband sampling rate of 15.36 MHz, and a Worldwide Interoperability for Microwave Access (WiMAX) base station using the same system bandwidth has a baseband sampling rate of 11.2 MHz. Accordingly, in order to replace only a channel card among the internal construction of the WiMAX base station with an LTE modem and to use the RUs of the WiMAX base station in its current configuration, or to connect a Radio Frequency (RF) Unit (RU) of one WiMAX base station for a dual modem supporting both the LTE and the WiMAX, a sampling rate conversion by a rate of 15.36/11.2=48/35 is necessary. In order to perform the low-pass filtering having a low cut-off frequency while maintaining a predetermined level of a signal quality, such as an Error Vector Magnitude (EVM), in the process of the sampling rate conversion, an approximated number of 500 (e.g. the number of taps, i.e., K=500) of the FIR filters are required. Accordingly, the sampling conversion having a complex rate resultantly accompanied by replacing only the channel card of the WiMAX base station with the LTE modem and using the RUs of the WiMAX base station in its current configuration, or connecting an RU of one WiMAX base station for a dual modem supporting both the LTE and the WiMAX cannot be implemented through the related method of converting the sampling rate.

Accordingly, exemplary embodiments of the present invention provide a method and an apparatus for generating a signal having a converted sampling rate by a method and an apparatus for converting a sampling rate which can be implemented for a rate of a complex fraction. More specifically, the sampling rate converting apparatus according to exemplary embodiments of the present invention controls an input stream and an output stream such that internal clocks increased through a process of a sampling rate conversion of an expander and a calculation amount of complex number multiplications for each output sample of a low-pass filtering are reduced, and selects a low-pass filter coefficient corresponding to the controlled input stream and output stream.

Figure 6:
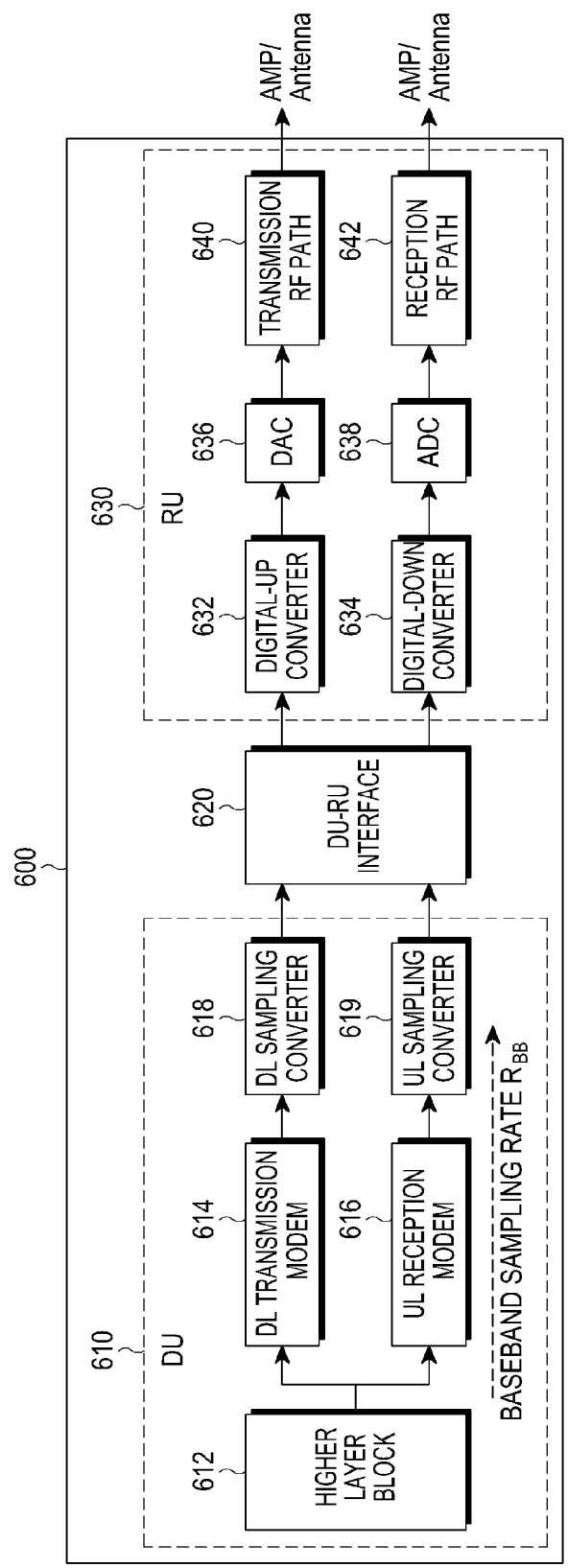
FIG. 6 is a block diagram illustrating a base station according to an exemplary embodiment of the present invention.

FIG. 6 is a block diagram illustrating a base station including a sampling converting apparatus according to an exemplary embodiment of the present invention.

Referring to FIG. 6, a base station 600 includes a Digital Unit (DU) 610 for processing a transmission/reception signal in a baseband, an RU 630 for processing a transmission/reception signal in an Inter Frequency (IR) band or an RF band, and a DU-RU interface 620 for serving as an interface between the DU 610 and the RU 630. The DU 610 includes a higher layer block 612, a Down Link (DL) transmission modem 614, an Up Link (UL) reception modem 616, a DL sampling converter 618, and a UL sampling converter 619.

Here, it is assumed that a baseband sampling rate for an output stream of the DU 610 is $R_{BB}$. The DL sampling converter 618 and the UL sampling converter 619 perform a sampling rate conversion for input streams to output signals having a sampling rate $R_{RU}$.

Exemplary embodiments of the present invention are described herein based on an example in which the sampling rate converter for converting the baseband sampling rate for the DU to the sampling rate of the RU in the base station is located in a DU output terminal of the base station. Accordingly, the DL sampling converter 618 and the UL sampling converter 619 are located in a DU output terminal of the base station. However, the position of the sampling rate converter is not limited to the aforementioned position and it is a matter of course that the sampling rate converter is located between two units having a sampling rate difference in different forms and operatively connects two units.

The RU 630 includes a digital-up converter 632, a digital-down converter 634, a Digital Analog Converter (DAC) 636, an Analog Digital Converter (ADC) 638, a transmission RF path 640, and a reception RF path 642. According to an exemplary embodiment of the present invention, the RU 630 receives the input stream having the sampling rate $R_{RU}$ through the DL sampling converter 618 and the UL sampling converter 619.

Figure 7:
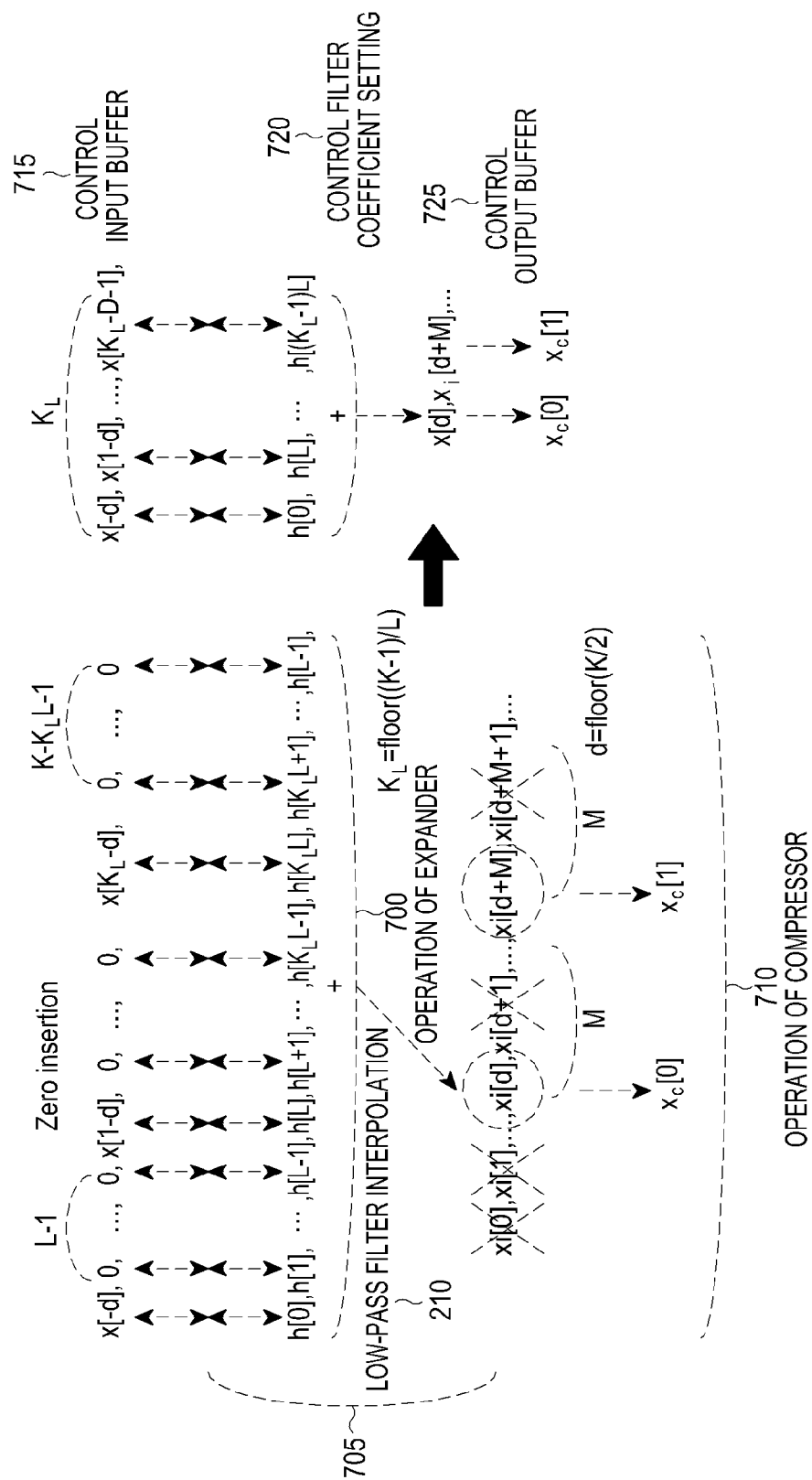
FIG. 7 is a diagram illustrating a process of a sampling rate conversion according to an exemplary embodiment of the present invention.

FIG. 7 is a diagram illustrating a process of a sampling rate conversion according to an exemplary embodiment of the present invention.

In FIG. 7, a process of a sampling rate conversion according to exemplary embodiments of the present invention will be described in comparison to the operation of the rate converting apparatus 200 illustrated in FIG. 2. Here, it is assumed that a rate of a sampling rate conversion is L/M.

Referring to FIG. 7, in the related process for converting a sampling rate, the expander 205 inserts L-1 number of "0"s in an input stream in step 700. Accordingly, when a low-pass filtering is performed in step 705, the number of samples (i.e., not 0) multiplied by a filter coefficient of the tap K among input samples input from the expander 205 is only $K_L = \lfloor (K-1)/L \rfloor$. Herein, $\lfloor (a) \rfloor$ is a descending calculation outputting a maximum integral equal to or smaller than "a". That is, $K-K_L$, times of multiplex number multiplications multiplied by "0" among K times of multiplex number multiplications performed by the low-pass filter 210 are actually unnecessary. Further, in step 705, the low-pass filtering is continuously performed for each output sample of the expander 205 to output LN+K-1 number of interpolated samples. However, because the expander 215 finally outputs only one sample for every M number of samples after a sample corresponding to a filter delay $d = \lfloor K/2 \rfloor$ in step 710, the low-pass filtering for M-1 number of samples is also unnecessary.

Accordingly, the sampling converting apparatus according to exemplary embodiments of the present invention includes a controller for performing a control operation to be described below without the aforementioned unnecessary operations.

First, as denoted by reference number 715, the controller controls an input buffer such that the input buffer selects as many effective interpolation input sample indexes as the number (e.g., not "0", i.e., $K_L$) of samples output in step 700 and multiplied with the filter coefficient of the tap K, when the low-pass filtering is performed.

Second, as denoted by reference number 720, the controller divides filter coefficients of the tap K into L number of filter coefficient sets having a length $K_L$ of the tap corresponding to $K_L$ number of effective interpolation input sample indexes. The controller controls the low-pass filtering operation such that a filter coefficient corresponding to a corresponding interpolation input sample index among the filter coefficients included in the filter coefficient set is adaptively selected and a multiplex number multiplication is performed.

Finally, at step 725, the controller controls an output buffer such that indexes, d, d+M, . . . , of the output sample of the interpolation operation corresponding to an index n of a final effective output sample $x_c[n]$ are selected from among the samples output in step 710. Herein, the input buffer and the output buffer are devices for operatively storing the input samples input to the sampling rate converting apparatus and the output samples output from the sampling rate converting apparatus.

For the sake of convenience, the control operation according to exemplary embodiments of the present invention will be described in more detail on an assumption that the number of final output streams having a sampling rate converted in a rate L/M is N×L/M=L and L number of samples are output for every M number of input samples, wherein K is an odd number and $K_L$ is an even number.

First, in reference number 720, a filter coefficient of the tap K is L number of filter coefficient sets including ($K_L$×1) number of tap filter coefficient vectors and represented by Equation 4.

$$H_L = \{h_0, h_1, \ldots, h_{L-1}\} \quad (4)$$
$$h_l = [h_l[0], h_l[1], \ldots h_l[K_L - 1]], l = 0, 1, \ldots, L-1$$
$$h_l[i] \equiv h\left[Li + \left\lceil \frac{Ml}{L} \right\rceil L - Ml\right], i = 0, 1, \ldots, K_L - 1$$

Here, $\lceil a \rceil$ represents an ascending calculation of outputting a minimum integral equal to or larger than a.

The controller multiplies ($K_L$×1) number of input sample vectors determined according to an effective interpolation output sample index k among the input streams stored in the input buffer, and ($K_L$×1) number of filter coefficient vectors selected from the filter coefficient vectors included in the L number of filter coefficient sets. Accordingly, exemplary embodiments of the present invention may exclude the multiplication by "0"s inserted in step 700 and generate the effective interpolation output sample in reference number 725. The ($K_L$×1) number of input sample vectors $x_n$ for the effective interpolation output sample index k is represented by Equation 5.

$$x_{I(K)} = [x[I(k) + 0], x[I(k) + 1], \ldots, x[I(k) + K_L - 1]]^T, \quad (5)$$
$$I(k) = \left\lceil \frac{Mk - d}{L} \right\rceil, x[n] = 0 \text{ for } n < 0$$

Referring to Equation 5, I(n) represents a start sample index of the input sample vector corresponding to the effective interpolation output sample among the input samples stored in the input buffer, and $d=\lfloor k/2 \rfloor$ represents a filter delay.

A result of performing the low-pass filtering for the input sample vector $x_{I(k)}$ using the filter coefficient selected in reference number 720, (i.e. the output sample having the sampling rate converted by the rate L/M) is represented by Equation 6.

$$x_{Out}[k] = h_{(k\ \%\ L)}x_{I(k)} = \sum_{i=0}^{K_L-1} h\left[Li+\left\lceil\frac{M(k\ \%\ L)}{L}\right\rceil L - M(k\ \%\ L)\right]x\left[\left\lceil\frac{Mk-d}{L}\right\rceil+i\right], \quad (6)$$

$$k = 0, 1, \ldots, L-1, \ldots$$

Referring to Equation 6, % represents a modulo calculation.

More specifically, the sampling converting apparatus according to exemplary embodiments of the present invention discriminates an operation for controlling the input buffer and the output buffer from an operation for setting the filter coefficient according to a result of a comparison of sizes of the input sampling rate $R_{In}$ and the output sampling rate $R_{Out}$. That is, when the result of the comparison of the sizes of the input sampling rate $R_{In}$ and the output sampling rate $R_{Out}$ is $R_{In} > R_{Out}$ (L<M), the sampling converting apparatus according to an exemplary embodiment of the present invention controls such that the controller performs an operation for storing the input sample in the input buffer so as to correspond to the input sampling rate $R_{In}$, and performs an adaptive filtering process of fetching the input sample from the input buffer so as to correspond to the output sampling rate $R_{Out}$ and multiplying the fetched input sample and a corresponding filter coefficient vector. Further, when the result of the comparison of the sizes of the input sampling rate $R_{In}$ and the output sampling rate $R_{Out}$ is $R_{In} < R_{Out}$ (L>M), the sampling converting apparatus according to an exemplary embodiment of the present invention controls such that the controller performs an adaptive filtering for the input samples based on the output samples stored in the output buffer, outputs the output samples according to the operation of the adaptive filtering so as to correspond to the input sampling rate $R_{In}$, and outputs the output samples so as to correspond to the sampling rate $R_{Out}$.

Figure 8:
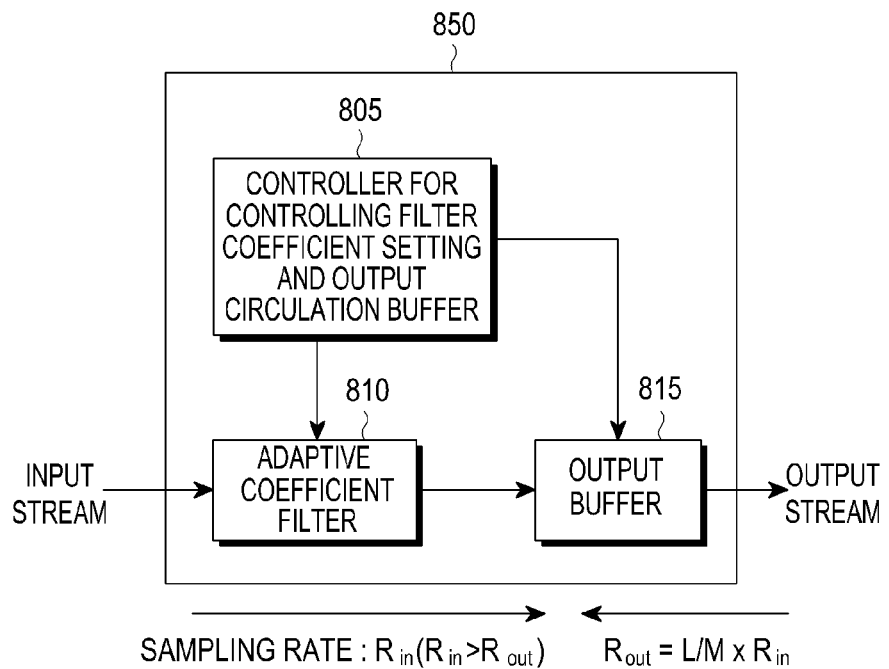
FIG. 8 is a block diagram illustrating a sampling converting apparatus according to an exemplary embodiment of the present invention.

FIG. 8 is a block diagram illustrating a sampling converting apparatus according to an exemplary embodiment of the present invention.

Referring to FIG. 8, the sampling converting apparatus 850 includes a controller 805 for controlling a filter coefficient setting and an output circulation buffer 815, an adaptive coefficient filter 810, and the output circulation buffer 815.

The controller 805 operatively stores input samples configuring an input stream so as to correspond to the input sampling rate $R_{In}$ in an input buffer (not shown). The controller 805 controls the adaptive coefficient filter 810 such that an input sample vector corresponding to the input samples stored in the input buffer is fetched and an adaptive filtering process corresponding to the output sampling rate $R_{Out}$ is performed. That is, the controller 805 controls such that L number of input samples are selected for every M number of input samples from the input buffer, the input sample vectors corresponding to the L number of selected input samples are multiplied by each of L number of filter coefficient vectors so that the L number of output samples are input to the output buffer 815. In an example in which the number of input samples input to the sampling converting device 850 for a unit time is larger than the number of output samples, the controller 805 controls the adaptive coefficient filter 810 such that some of the L number of filter coefficient vectors are doubly selected or M–L number of filter coefficient vectors are added to the L number of filter coefficient vectors, so that as many filter coefficient vectors as the number of input samples are generated. Accordingly, the index l of the filter coefficient vector selected for an index n of the input sample is represented by Equation 7.

$$l=\lfloor mL/M \rfloor, \quad m=(n+M-d)\%M \quad (7)$$

Referring to Equation 7, $\lfloor (a) \rfloor$ is a descending calculation outputting a maximum integral equal to or smaller than "a", and the index m represents a position in which the output of the adaptive coefficient filter 810 is stored in the output buffer.

For example, in order to generate as many filter coefficient vectors as the number of input samples, the controller 805 adds M–L number of filter coefficient vectors to L number of filter coefficient vectors and configures the adaptive coefficient filter 810 with M filter coefficient vector sets. According to such examples, the M–L number of added filter coefficient vectors are sequentially selected in the L number of filter coefficient vectors and the index is given as l=m. The adaptive coefficient filter 810 stores M number of samples obtained by multiplying M input sample vectors for every M number of input samples and a filter coefficient corresponding to each of the M input sample vectors according to an instruction of the controller 805 in the output buffer 815. The output buffer 815 outputs L number of effective output samples selected so as to correspond to the sampling rate of $R_{Out}$ among the stored output samples by the controller 805. For example, an index m' of the output buffer 815 to be fetched for the index k of a corresponding effective output sample output from the output buffer 815 is represented by Equation 8.

$$m' = \left\lceil\frac{Mk}{L}\right\rceil \% M \quad (8)$$

In this case, the number of times of multiplex number multiplications for each output sample are increased from $K_L$ times to $K_L(M/L)$ times due to the calculation with the M–L number of filter coefficients added for convenience of implementation, but are decreased by approximately $M/L^2$ compared to the multiplication calculation amount, M×K times, of the conventional method. Further, an internal clock of the sampling rate converting apparatus 850 is $R_{In}$=max ($R_{In}$, $R_{Out}$), so it is decreased by 1/L times compared to the internal clock L×$R_{In}$ of the conventional method.

Figure 9:
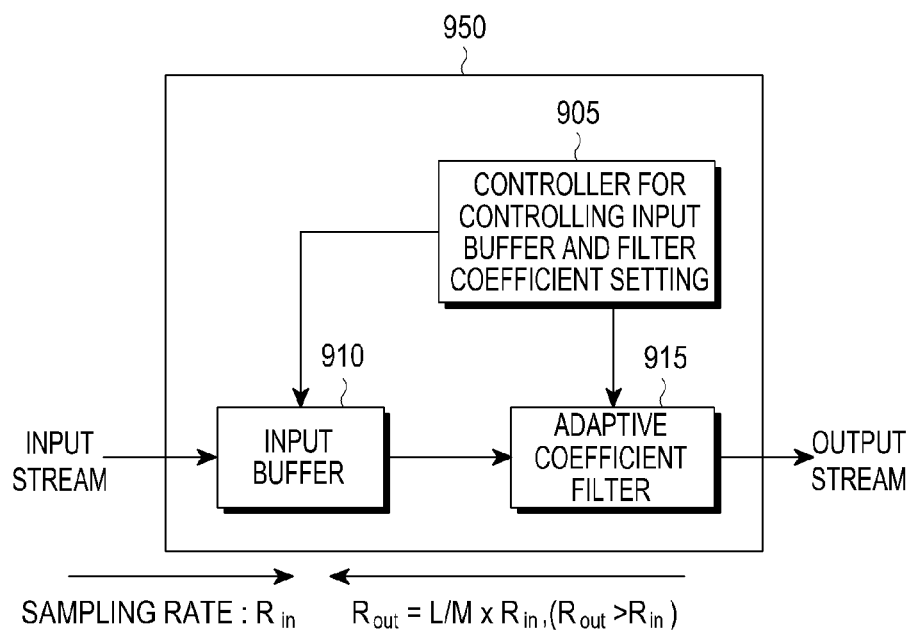
FIG. 9 is a block diagram illustrating a sampling converting apparatus according to an exemplary embodiment of the present invention.

FIG. 9 is a block diagram illustrating a sampling converting apparatus according to an exemplary embodiment of the present invention.

Referring to FIG. 9, a sampling converting apparatus 950 includes a controller 905 for controlling an input buffer 910 and a filter coefficient setting, the input buffer 910, and an adaptive coefficient filter 915.

The controller 905 controls the adaptive coefficient filter 915 such that the adaptive coefficient filter 915 performs the adaptive filtering for the input samples based on the output samples because the number of output samples are smaller than that of the input samples, a storage operation of an output buffer (not shown) for storing an output of the adaptive coefficient filter 915 is performed so as to correspond to the input sampling rate $R_{In}$, and an operation of fetching output samples in the output buffer is performed so as to correspond to the output sampling rate $R_{Out}$. In this case, because the number of input samples input to the sampling converting apparatus 950 for a unit time is smaller than the number of output samples, the controller 905 selects (L−M) number of input sample vectors twice among the input sample vectors corresponding to M number of input samples.

The controller 905 controls the adaptive coefficient filter 915 such that the adaptive coefficient filter 915 multiplies the selected input sample vectors and L number of filter coefficients and outputs L number of output samples. That is, the adaptive coefficient filter 915 outputs the M determined output samples by multiplying the M input sample vectors permitted for duplication and selected from the input samples vectors corresponding to the input samples stored in the input buffer 910 and the filter coefficients selected in the controller 905 so as to correspond to the output sampling rate $R_{Out}$.

Equation 9 represents an index m for storing the input sample n selected according to the instruction of the controller 905 in the input buffer.

$$m = (n+d)\%M \qquad (9)$$

In this case, (KL×1) number of input sample vectors rm' to be fetched from the input buffer 910 for the output sample index k and the start index m' are represented by Equation 10.

$$r_{m'} = [r[m'], r[(m'+1)\% M], \ldots, r[(m'+K_L-1)\% M]]^T, \qquad (10)$$

$$m' = \left\lfloor \frac{Mk}{L} \right\rfloor \% M$$

For example, it is assumed that an index of the filter coefficient vector for the index k of the output sample is given as l=(k % L). In this case, the times of multiplex number multiplications for each output sample correspond to $K_L$ times which is decreased by approximately 1/ML times compared to the multiplication calculation amount, M×K times, of the related method. An internal clock is $R_{Out}$=max $(R_{In}, R_{Out})$. Accordingly, the internal clock is decreased by 1/M times compared to the internal clock $L \times R_{In}$ of the related method.

Hereinafter, an example of a method of converting a sampling rate for connecting two base stations supporting a heterogeneous communication system, to which exemplary embodiments of the present invention may be more specifically applied will be described. For example, if it is assumed that the two base stations are an LTE base station for supporting an LTE system and a WiMAX base station for supporting a WiMAX system, and in order to connect a DU of the LTE base station to an RU of the WiMAX base station, the sampling rate conversion according to exemplary embodiments of the present invention is performed to generate a signal having a converted sampling rate.

Figure 10:
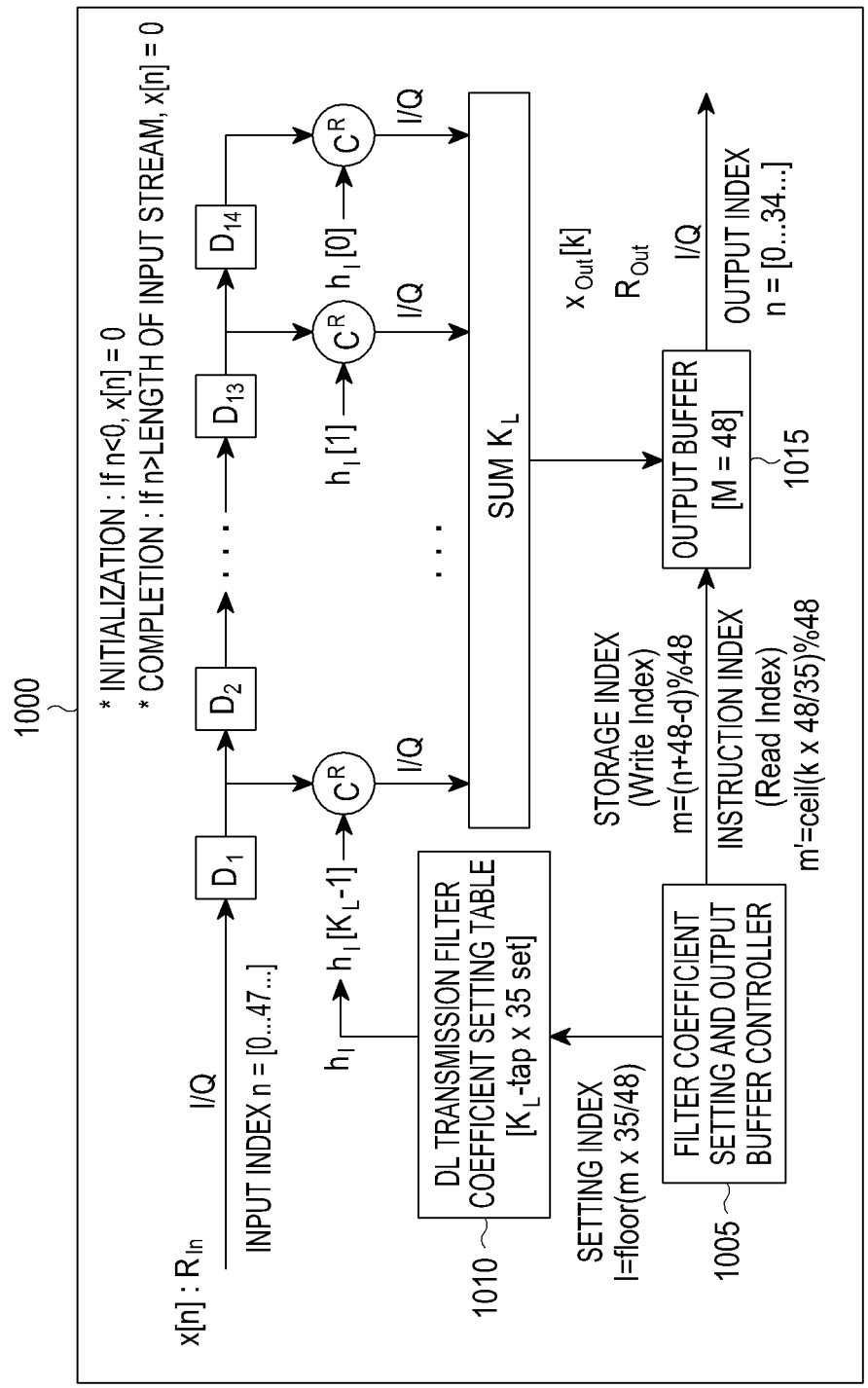
FIG. 10 is a diagram illustrating an example of a sampling rate converting apparatus according to an exemplary embodiment of the present invention.

FIG. 10 is a diagram illustrating an example of a sampling rate converting apparatus according to an exemplary embodiment of the present invention.

Referring to FIG. 10, the sampling rate converting apparatus 1000 has a structure in which the sampling rate is converted by the rate 38/45 in a DL. When input samples corresponding to an input sampling rate are input to an adaptive coefficient filter in the sampling rate converting apparatus 1000, a DL transmission filter coefficient setting Table 1010 performs a filtering while changing an index of a filter coefficient vector for a corresponding input sample according to an instruction of a filter coefficient setting and output buffer controller 1005, and a value of a sum of the filtering results is stored in the output buffer 1015. Simultaneously, when the output buffer 1015 fetches and outputs the output sample corresponding to an index of the output sample selected in the filter coefficient setting and output buffer controller 1005 so as to correspond to an output sampling rate, the sampling rate conversion is completed and the output samples corresponding to the output sampling rate are generated.

Figure 11:
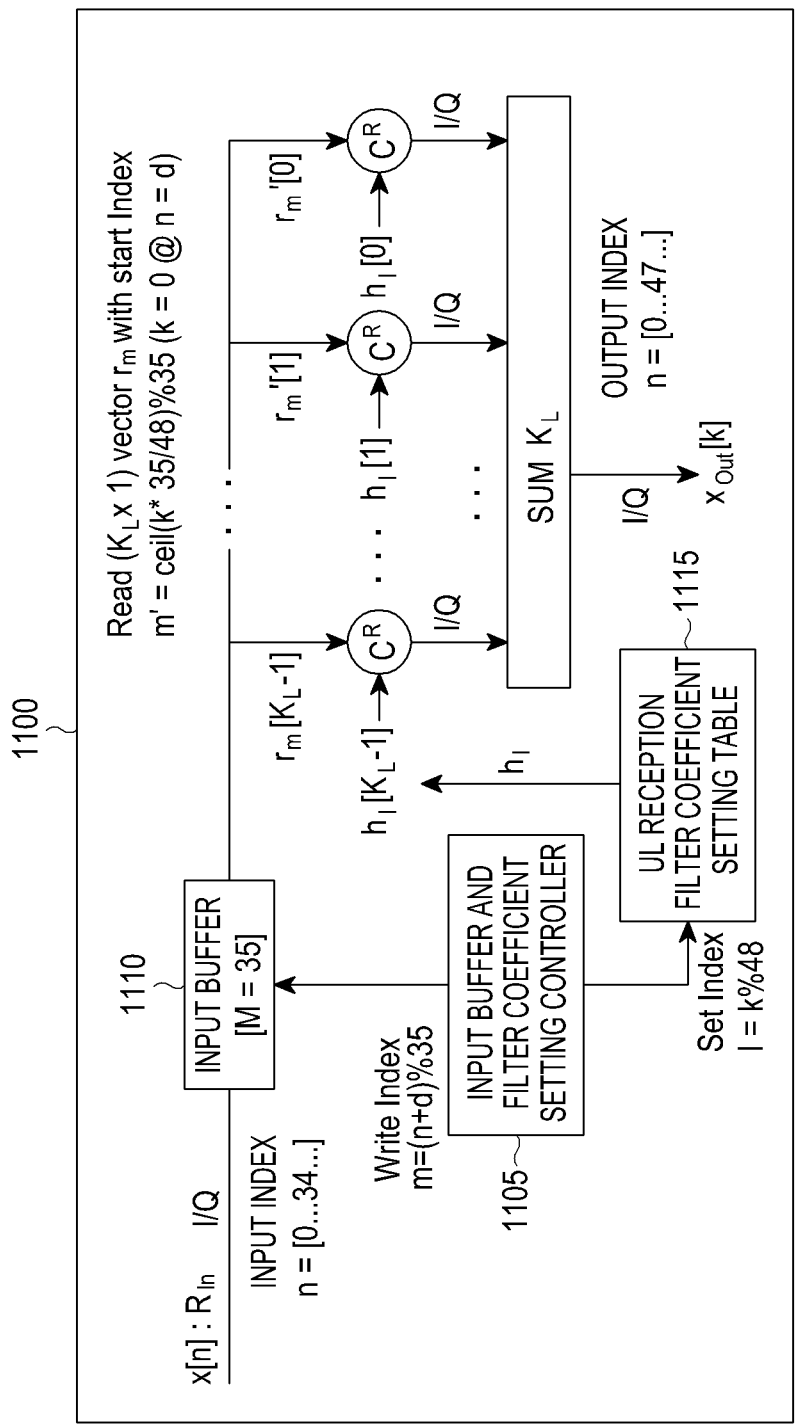
FIG. 11 is a diagram illustrating an example of a sampling rate converting apparatus according to an exemplary embodiment of the present invention.

FIG. 11 is a diagram illustrating an example of a sampling rate converting apparatus according to an exemplary embodiment of the present invention.

Referring to FIG. 11, the sampling rate converting apparatus 1100 has a structure in which the sampling rate is converted by the rate 45/38 in a UL. The sampling rate converting apparatus 1100 stores an input sample selected from input samples by an input buffer and filter coefficient setting controller 1105 so as to correspond to an input sampling rate in an input buffer 1110. A UL reception filter coefficient setting Table 1115 outputs an output sample obtained by multiplying a filter coefficient vector selected so as to correspond to an output sampling rate according to an instruction of the input buffer and filter coefficient setting controller 1105 and the selected input sample vector, the sampling rate conversion is completed and output samples corresponding to the output sampling rate are generated.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method of a communication device configured to generate a signal corresponding to a converted sampling rate in a communication system, the method comprising:
   receiving, by a sampling rate converting device, a stream of input samples having an input sampling rate corresponding to a first baseband sampling rate of a first communication system;
   generating a filter coefficient set comprising a number of filter coefficient vectors, the filter coefficients being generated by dividing a filter coefficient set having a length of a first tap configuring a low-pass filter into the filter coefficient vectors, a length of each filter coefficient vector corresponding to a length of a second tap;
   comparing the input sampling rate and an output sampling rate;
   based on the comparison, performing a first adaptive filtering process when the input sampling rate is larger than the output sampling rate, and performing a second adaptive filtering process when the input sampling rate is smaller than the output sampling rate; and
   generating, by the sampling rate converting device, an output signal with the converted sampling rate corresponding to the output sampling rate, wherein the converted sampling rate corresponds to a second baseband sampling rate of a second communication system;
   wherein performing the first adaptive filtering process includes:
      selecting at least one non-zero input sample corresponding to the input sampling rate for input samples corresponding to the output sampling rate among input samples included in the stream corresponding to the input sampling rate, wherein the number of selected input samples corresponds to the length of the second tap;

selecting at least one filter coefficient corresponding to each of the at least one non-zero input sample in the filter coefficient set, comprising adding a difference number of filter coefficient vectors to filter coefficient vectors corresponding to the input sampling rate, wherein the difference number is a value obtained by subtracting a number corresponding to the input sampling rate from a number corresponding to the output sampling rate, outputting output samples corresponding to the output sampling rate which is converted by the sampling rate converting device from the input sampling rate so as to correspond to the converted rate by multiplying each of the at least one non-zero input sample and the selected at least one filter coefficient based on the comparison result.

2. The method as claimed in claim 1, wherein if the input sampling rate is smaller than the output sampling rate, doubly selecting some input samples from input samples corresponding to the output sampling rate among the input samples and selecting the at least one non-zero input sample corresponding to the input sampling rate.

3. The method as claimed in claim 2, wherein the selecting of the at least one filter coefficient comprises selecting at least one filter coefficient vector corresponding to the output sampling rate in the filter coefficient set.

4. A communication device configured to generate a signal corresponding to a converted sampling rate in a communication system, the device comprising:

an input buffer configured to store a stream of input samples corresponding to an input sampling rate received in a first communication system using a first baseband sampling rate; and a baseband sampling rate converting device comprising a controller configured to:

generate a filter coefficient set comprising a number of filter coefficient vectors, the filter coefficients being generated by dividing a filter coefficient set having a length of a first tap configuring a low-pass filter into the filter coefficient vectors, a length of each filter coefficient vector corresponding to a length of a second tap, compare the input sampling rate and an output sampling rate, and based on the comparison, control the performance of a first adaptive filtering process when the input sampling rate is larger than the output sampling rate, and control the performance of a second adaptive filtering process when the input sampling rate is smaller than the output sampling rate, and control an output buffer such that the output buffer outputs output samples corresponding to the output sampling rate which is converted from the input sampling rate so as to correspond to a conversion rate among output samples output from a low-pass filter based on the comparison result, wherein performing the first adaptive filtering process includes:

selecting at least one non-zero input sample corresponding to the input sampling rate for input samples corresponding to the output sampling rate among input samples included in the stream corresponding to the input sampling rate, wherein the number of selected input samples corresponds to the length of the second tap, selecting at least one filter coefficient corresponding to the at least one non-zero input sample in the filter coefficient set, comprising adding a difference number of filter coefficient vectors to filter coefficient vectors corresponding to the input sampling rate, wherein the difference number is a value obtained by subtracting a number corresponding to the input sampling rate from a number corresponding to the output sampling rate, and controlling the low-pass filter such that the at least one non-zero input sample is multiplied with the selected at least one filter coefficient.

5. The device of claim 4, wherein if the input sampling rate is smaller than the output sampling rate, the controller is configured to doubly select some input samples from input samples corresponding to the output sampling rate among the input samples and to select the at least one non-zero input sample corresponding to input sampling rate.

6. The device of claim 5, wherein the controller selects at least one filter coefficient vector corresponding to the output sampling rate in the filter coefficient set.

* * * * *